United States Patent
Yu et al.

(10) Patent No.: US 11,869,955 B2
(45) Date of Patent: Jan. 9, 2024

(54) INTEGRATED CIRCUIT WITH NANOSHEET TRANSISTORS WITH ROBUST GATE OXIDE

(71) Applicant: Taiwan Semiconductor Manufacturing Co., Ltd., Hsinchu (TW)

(72) Inventors: Jia-Ni Yu, Hsinchu (TW); Kuo-Cheng Chiang, Hsinchu (TW); Mao-Lin Huang, Hsinchu (TW); Lung-Kun Chu, Hsinchu (TW); Chung-Wei Hsu, Hsinchu (TW); Chih-Hao Wang, Hsinchu (TW); Kuan-Lun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 195 days.

(21) Appl. No.: 17/370,822

(22) Filed: Jul. 8, 2021

(65) Prior Publication Data

US 2023/0009349 A1 Jan. 12, 2023

(51) Int. Cl.
| | |
|---|---|
| *H01L 29/423* | (2006.01) |
| *H01L 29/06* | (2006.01) |
| *H01L 29/786* | (2006.01) |
| *H01L 21/8234* | (2006.01) |
| *H01L 29/51* | (2006.01) |
| *H01L 21/28* | (2006.01) |
| *H01L 21/3115* | (2006.01) |
| *H01L 27/088* | (2006.01) |

(52) U.S. Cl.
CPC .. *H01L 29/42392* (2013.01); *H01L 21/28185* (2013.01); *H01L 21/3115* (2013.01); *H01L 21/823412* (2013.01); *H01L 21/823431* (2013.01); *H01L 21/823437* (2013.01); *H01L 21/823462* (2013.01); *H01L 27/0886* (2013.01); *H01L 29/0665* (2013.01); *H01L 29/513* (2013.01); *H01L 29/78696* (2013.01)

(58) Field of Classification Search
CPC ......... H01L 21/28158; H01L 21/28185; H01L 21/3115; H01L 21/823412; H01L 21/823431; H01L 21/823437; H01L 21/823462; H01L 27/088; H01L 27/0886; H01L 29/0665; H01L 29/0673; H01L 29/42392; H01L 29/513; H01L 29/517; H01L 29/66439; H01L 29/66545; H01L 29/775; H01L 29/78696; B82Y 10/00; B82Y 40/00
See application file for complete search history.

(56) References Cited

U.S. PATENT DOCUMENTS

2020/0043808 A1* 2/2020 Bao .................. H01L 21/28088

* cited by examiner

*Primary Examiner* — Cheung Lee
(74) *Attorney, Agent, or Firm* — Seed IP Law Group LLP

(57) ABSTRACT

A method for processing an integrated circuit includes forming I/O gate all around transistors and core gate all around transistors. The method performs a regrowth process on an interfacial dielectric layer of the I/O gate all around transistors by diffusing metal atoms into the interfacial dielectric layer of the I/O gate all around transistor. The regrowth process does not diffuse metal atoms into the interfacial gate dielectric layer of the core gate all around transistor.

20 Claims, 14 Drawing Sheets

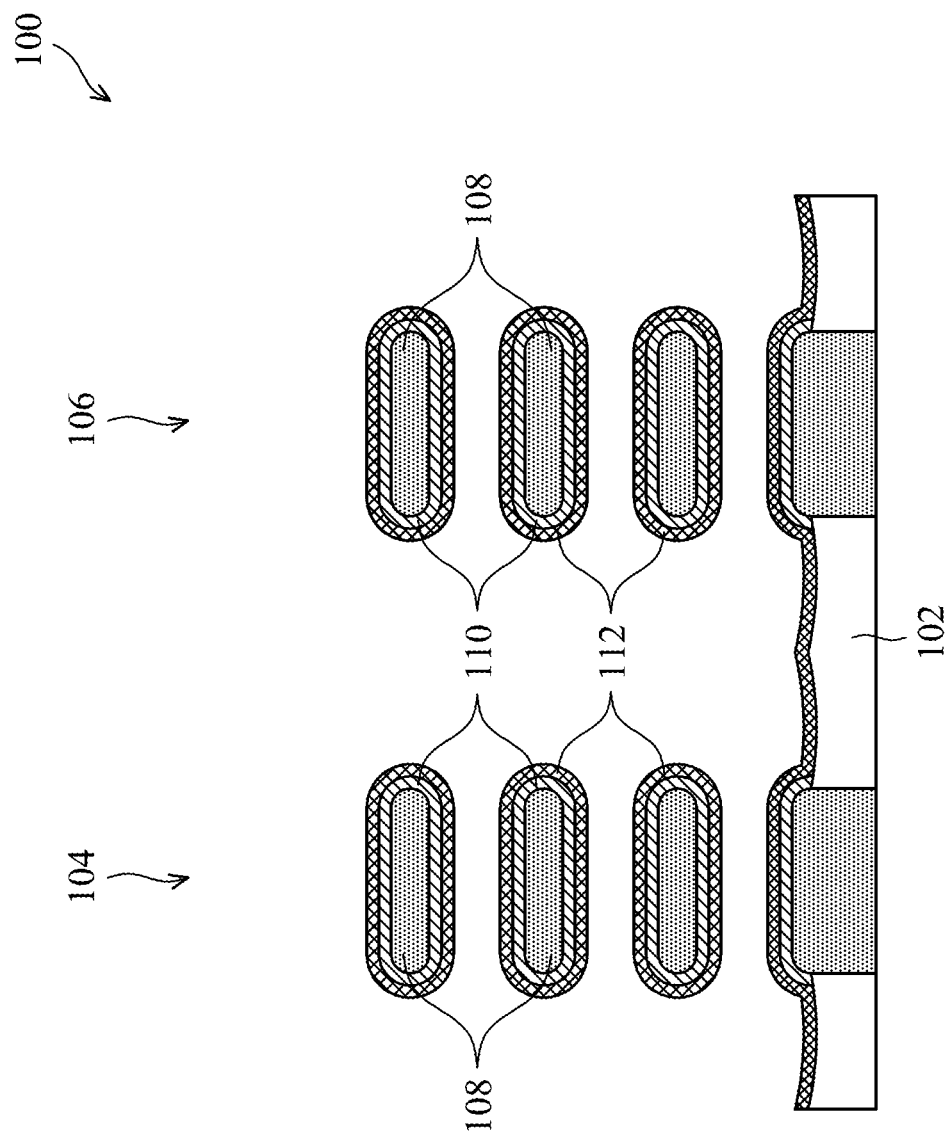

INTEGRATED CIRCUIT WITH NANOSHEET TRANSISTORS WITH ROBUST GATE OXIDE

BACKGROUND

Technical Field

The present disclosure relates to the field of semiconductor fabrication. The present disclosure relates more particularly to fabrication of gate all around transistors.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Integrated circuits may include input-output (I/O) transistors and core transistors. I/O transistors are typically designed to be able to withstand higher voltages across their terminals than are core transistors. Accordingly, I/O transistors may have larger dimensions in some of their features than the core transistors. However, this can cause problems with certain types of transistors, including nanosheet transistors.

BRIEF DESCRIPTION OF THE SEVERAL VIEWS OF THE DRAWINGS

FIGS. 1A-1L are cross-sectional views of an integrated circuit at various stages of processing, according to one embodiment.

DETAILED DESCRIPTION

Figure 1B:
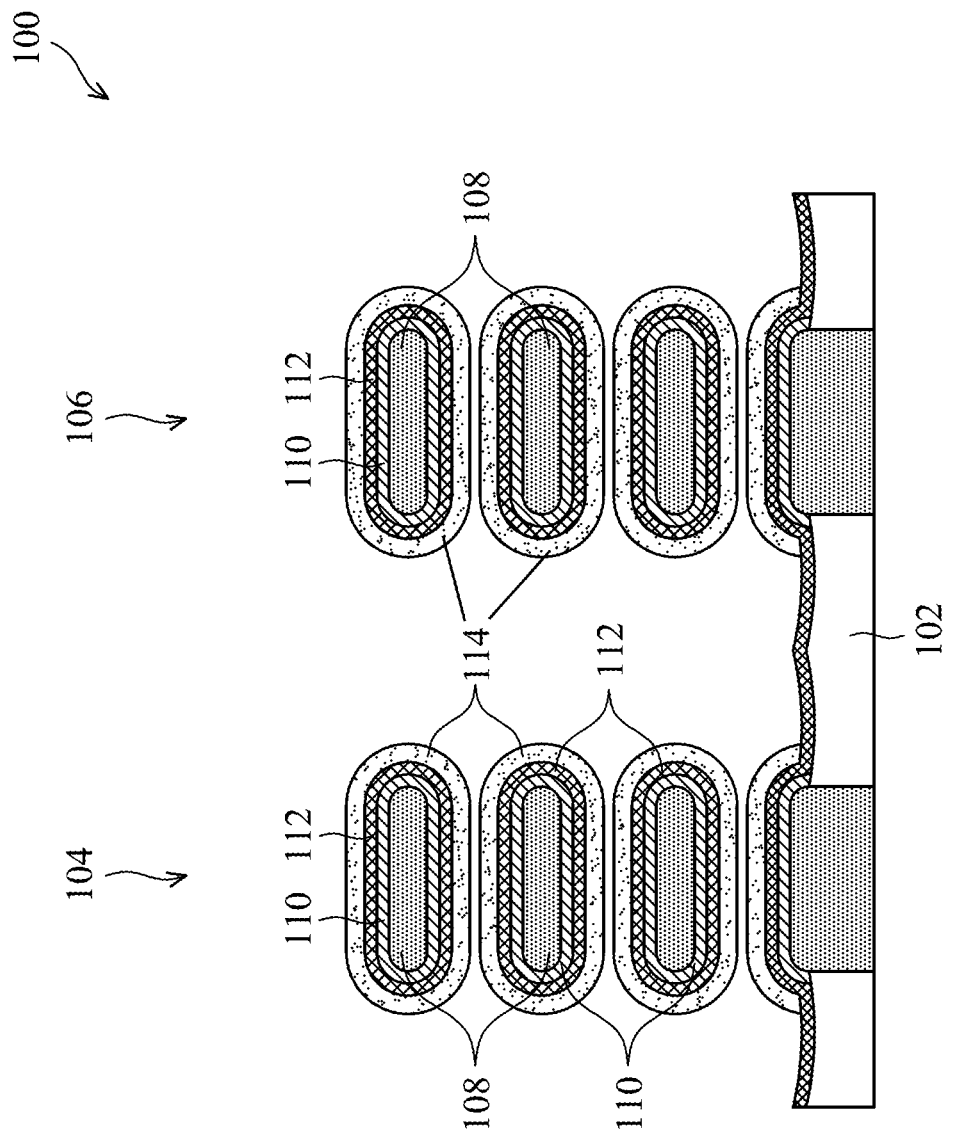

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure of the present disclosure provide an integrated circuit including multiple types of nanosheet transistors. The multiple types of nanosheet transistors can include I/O transistors and core transistors. Embodiments of the present disclosure enable the I/O transistors to have robust gate dielectrics without substantially thicker gate dielectrics than the core transistors.

FIGS. 1A-L are cross-sectional views of an integrated circuit 100 at successive intermediate stages of processing, according to one embodiment. FIGS. 1A-L illustrate an exemplary process for producing an integrated circuit that includes multiple types of nanosheet transistors. FIGS. 1A-L illustrate how these types of transistors can be formed in a simple and effective process in accordance with principles of the present disclosure. Other process steps and combinations of process steps can be utilized without departing from the scope of the present disclosure.

FIG. 1A is a cross-sectional diagram of an integrated circuit 100 at an intermediate stage of processing, according to one embodiment. The view of FIG. 1A illustrates a transistor 106 and a transistor 104. The transistors 106 and 104 are formed in the same integrated circuit 100, though they may be located at different regions of the integrated circuit 100. In one example, the transistor 104 is an I/O transistor and the transistor 106 is a core transistor.

The integrated circuit 100 can include a large number of core transistors 106 coupled together in complex arrangements. The core transistors 106 cooperate to process data, to write data to memory, to read data from memory, and to execute software instructions. The core transistors can be coupled together by metal interconnects formed in the integrated circuit 100.

Because there may be a large number of core transistors performing a large number of tasks, it is possible that the core transistors 106 can utilize a large amount of power. The high-power usage can result in the generation of large amounts of heat. This can be problematic if the integrated circuit 100 is not able to safely dissipate the heat generated by the core transistors 106.

In order to reduce the amount of heat generated by the core transistors 106, the core transistors 106 may operate on relatively low voltages. For example, the core transistors 106 may operate on voltages between 0.7 V and 1.1 V, though other voltages can be utilized without departing from the scope of the present disclosure. Smaller supply voltage values result in smaller amounts of power utilized by the core transistors 106

The I/O transistors 104 are coupled between the core transistors 106 and I/O terminals (not shown) of the integrated circuit 100. The I/O transistors 104 are designed to withstand higher voltages than the core transistors 106. Accordingly, when higher voltages appear at the terminals of the integrated circuit 100, the I/O transistors 104 are able to withstand the higher voltages without being damaged and can thus protect the core transistors 106 from the higher voltages. FIGS. 1A-1L illustrate only a single I/O transistor 104 and a single core transistor 106, though in practice, the integrated circuit 100 will include many more transistors of each type.

The transistors 104 and 106 are gate all around transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The integrated circuit 100 includes a semiconductor substrate 102. In one embodiment, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 102 includes silicon germanium (SiGe) buffer layers epitaxially grown on the silicon substrate 102. The germanium concentration of the SiGe buffer layers may increase from 30 atomic % germanium for the bottom-most buffer layer to 70 atomic % germanium for the top-most buffer layer. The substrate 102 may include various regions that have been suitably doped with impurities (e.g., p-type or n-type conductivity). The dopants are, for example boron ($BF_2$) for an n-type transistor and phosphorus for a p-type transistor.

The integrated circuit 100 may include one or more shallow trench isolations (not shown) separating the I/O transistors 104 from the core transistors 106, or separating the I/O transistors 104 from each other and the core transistors 106 from each other. The shallow trench isolation can be utilized to separate groups of transistor structures formed in conjunction with the semiconductor substrate 102. The shallow trench isolation can include a dielectric material. The dielectric material for the shallow trench isolation may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation without departing from the scope of the present disclosure.

The integrated circuit 100 includes a plurality of semiconductor nanosheets 108 or nanowires. The semiconductor nanosheets 108 are layers of semiconductor material. The semiconductor nanosheets 108 correspond to the channel regions of the transistors 104 and 106. The semiconductor nanosheets 108 are formed over the substrate 102. The semiconductor nanosheets 108 may include one or more layers of Si, Ge, SiGe, GaAs, InSb, GaP, GaSb, InAlAs, InGaAs, GaSbP, GaAsSb or InP. In one embodiment, the semiconductor nanosheets 108 are the same semiconductor material as the substrate 102. Other semiconductor materials can be utilized for the semiconductor nanosheets 108 without departing from the scope of the present disclosure.

In FIG. 1A, each transistor 104 and 106 have three semiconductor nanosheets 108. However, in practice, each transistor 104 and 106 may have many more semiconductor nanosheets 108 than three. For example, each transistor 104 may include between 3 and 20 semiconductor nanosheets 108. Other numbers of semiconductor nanosheets 108 can be utilized without departing from the scope of the present disclosure.

Each nanosheet 108 is covered by an interfacial dielectric layer 110. The interfacial dielectric layer 110 may be used in order to create a good interface between the semiconductor nanosheets 108 and subsequent dielectric layers, as will be described in further detail below. The interfacial dielectric layer 110 can assist in suppressing the mobility degradation of charge carries in the semiconductor nanosheets 108 that serve as channel regions of the transistors 104 and 106.

The interfacial dielectric layer 110 can include a dielectric material such as silicon oxide, silicon nitride, or other suitable dielectric materials. The interfacial dielectric layer 110 can include a comparatively low-K dielectric with respect to high-K dielectric such as hafnium oxide or other high-K dielectric materials that may be used in gate dielectrics of transistors. In the example of FIG. 1A, the interfacial dielectric layer 110 is silicon dioxide.

The interfacial dielectric layer 110 can be formed by a thermal oxidation process, a chemical vapor deposition (CVD) process, or an atomic layer deposition (ALD) process. The interfacial dielectric layer 110 can have a thickness between 0.5 nm and 2 nm. One consideration in selecting a thickness for the interfacial dielectric layer 110 is to leave sufficient space between the nanosheets 108 for gate metals, as will be explained in more detail below. Other materials, deposition processes, and thicknesses can be utilized for the interfacial dielectric layer 110 without departing from the scope of the present disclosure.

The interfacial dielectric layer 110 is covered by a high-K dielectric layer 112. The high-K dielectric layer 112 and the interfacial dielectric layer 110 collectively form a gate dielectric of the transistors 104 and 106. The high-K dielectric layer 112 and the interfacial dielectric layer 110 physically separate the semiconductor nanosheets 108 from the gate metals that will be deposited subsequent steps. The high-K dielectric layer 112 and the interfacial dielectric layer 110 isolate the gate metals from the semiconductor nanosheets 108 that correspond to the channel regions of the transistors.

The high-K dielectric layer 112 includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 112 may be formed by CVD, ALD, or any suitable method. In one embodiment, the high-K dielectric layer 112 is formed using a highly conformal deposition process such as ALD in order to ensure the formation of a gate dielectric layer having a uniform thickness around each semiconductor nanosheet 108. In one embodiment, the thickness of the high-k dielectric is in a range from about 1 nm to about 3 nm. Other thicknesses, deposition processes, and materials can be utilized for the high-K dielectric layer 112 without departing from the scope of the present disclosure. The high-K dielectric layer 112 may include a first layer that includes $HfO_2$ with dipole doping including La and Mg, and a second layer including a higher-K ZrO layer with crystallization. The high-k dielectric layer can be patterned with controlled ALE processes, as will be described in further detail below. The peak intensity of oxygen in the high-K dielectric layer can be higher for the transistor 104 than for the transistors 106.

As set forth previously, the I/O transistor 104 may be subject to a higher voltages than the core transistor 106. One way to ensure that the I/O transistor 104 can withstand the higher voltages is to make the interfacial dielectric layer 110 substantially thicker in the transistor 104 than in the transistor 106. This results in a thicker gate dielectric around the nanosheets 108. The thicker gate dielectric can withstand higher voltages without breaking down. However, if the interfacial dielectric layer 110 is too thick, then it is possible that a sufficiently thick layer of metal gate material will not be able to be deposited between adjacent nanosheets 108. In some cases, the gate dielectric covering two adjacent nanosheets 108 may even contact each other such that gate metal material cannot be deposited at all between the adjacent nanosheets 108. This could have highly negative effects on the performance of the transistor 104.

In one embodiment, at the stage of processing shown in FIG. 1A, the interfacial dielectric layer 110 has the same thickness on the nanosheets 108 of both the I/O transistor 104 and the core transistor 106. Accordingly, at the processing step shown in FIG. 1A, the interfacial dielectric layer 110 can be deposited on the nanosheets 108 of the I/O transistor 104 and the core transistor 106 in a same deposition step. Likewise, the high-K dielectric layer 112 can be formed on the interfacial dielectric layer 110 of the transistors 104 and 106 in a same deposition step or process. The high-K dielectric layer 112 can have a same thickness in the transistors 104 and 106.

FIG. 1B is a cross-sectional view of the integrated circuit 100 at an intermediate stage of processing, according to one embodiment. In FIG. 1B, a cap layer 114 has been deposited on the high-K dielectric layer 112 of both the I/O transistor 104 and the core transistor 106. The cap layer 114 can include one or more of TiN, TiSiN, AlO, or other suitable materials. The cap layer 114 can have a thickness between 1 nm and 5 nm. The thickness of the cap layer 114 is selected to leave a gap between adjacent nanosheets 108 of both the transistor 104 and the transistor 106. The cap layer 114 can be deposited by a physical vapor deposition (PVD) process, an ALD process, a CVD process, or other suitable deposition processes. The cap layer 114 can have other thicknesses, materials, and deposition processes without departing from the scope of the present disclosure.

One purpose of the cap layer 114 is to assist in a regrowth process of the interfacial dielectric layer 110 of the I/O transistor 104. The regrowth process utilizes material from the cap layer 114 to increase the thickness of the interfacial dielectric layer 110 of the transistor 104 while leaving the thickness of the interfacial dielectric layer 110 of the transistor 106 substantially unchanged. Further details regarding the regrowth process are provided below.

Figure 1C:
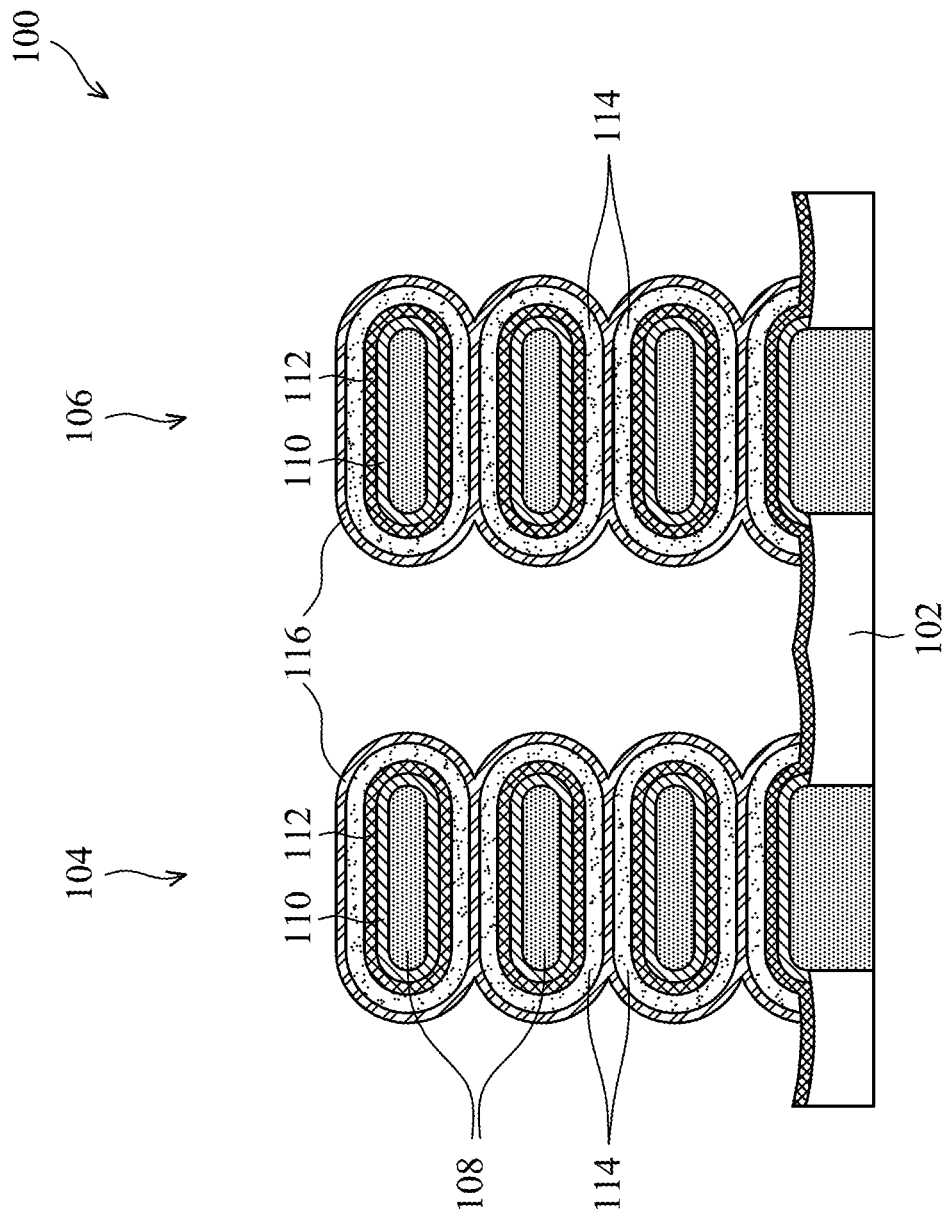

FIG. 1C is a cross-sectional view of the integrated circuit 100, according to one embodiment. In FIG. 1C, a hard mask layer 116 has been deposited on the cap layer 114 of both the I/O transistor 104 and the core transistor 106. The hard mask layer 116 can include one or more of AlO, SiN, or other suitable materials. The hard mask layer 116 can have a thickness between 1 nm and 5 nm. The thickness of the hard mask layer is selected to entirely fill in the remaining gap between adjacent nanosheets 108 of both the transistor 104 and the transistor 106. The hard mask layer 116 can be deposited by a PVD process, an ALD process, a CVD process, or other suitable deposition processes. The hard mask layer 116 can have other thicknesses, materials, and deposition processes without departing from the scope of the present disclosure.

Figure 1D:
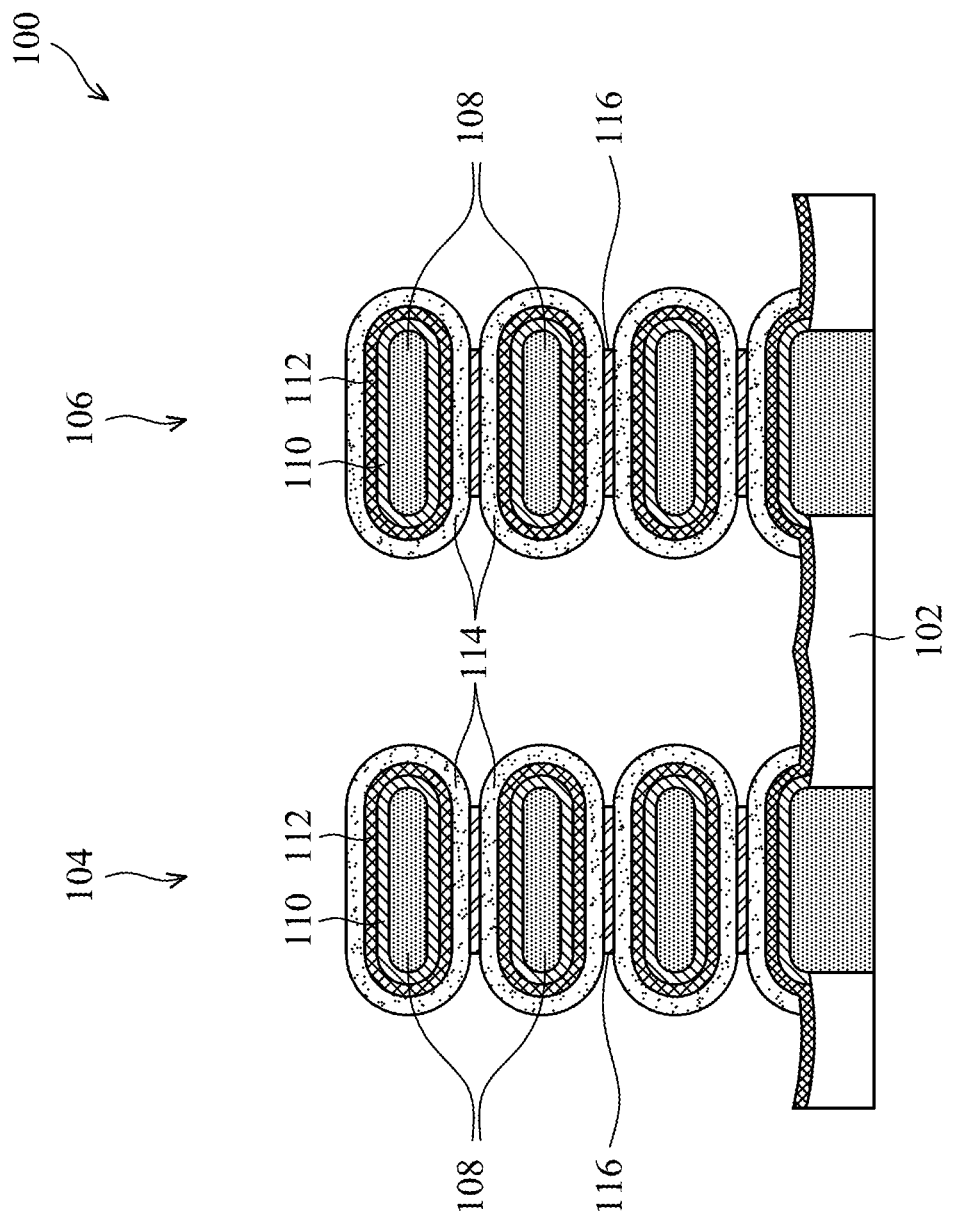

FIG. 1D is a cross-sectional view of the integrated circuit 100, according to one embodiment. In FIG. 1D the hard mask layer 116 has been etched back. The hard mask layer 116 can be etched back by an isotropic etching process. The isotropic etching process that etches the hard mask layer 116 and the same in all directions. The result of the isotropic etching process is that the hard mask layer 116 is completely removed from the cap layer 114 except directly between adjacent nanosheets 108. The isotropic etching process can include a wet etching process, a dry etching process, an atomic layer etching (ALE) process, or other suitable etching processes. The specific etchant can be selected to etch the specific material of the hard mask layer 116. Other etching processes can be utilized without departing from the scope of the present disclosure.

Figure 1E:
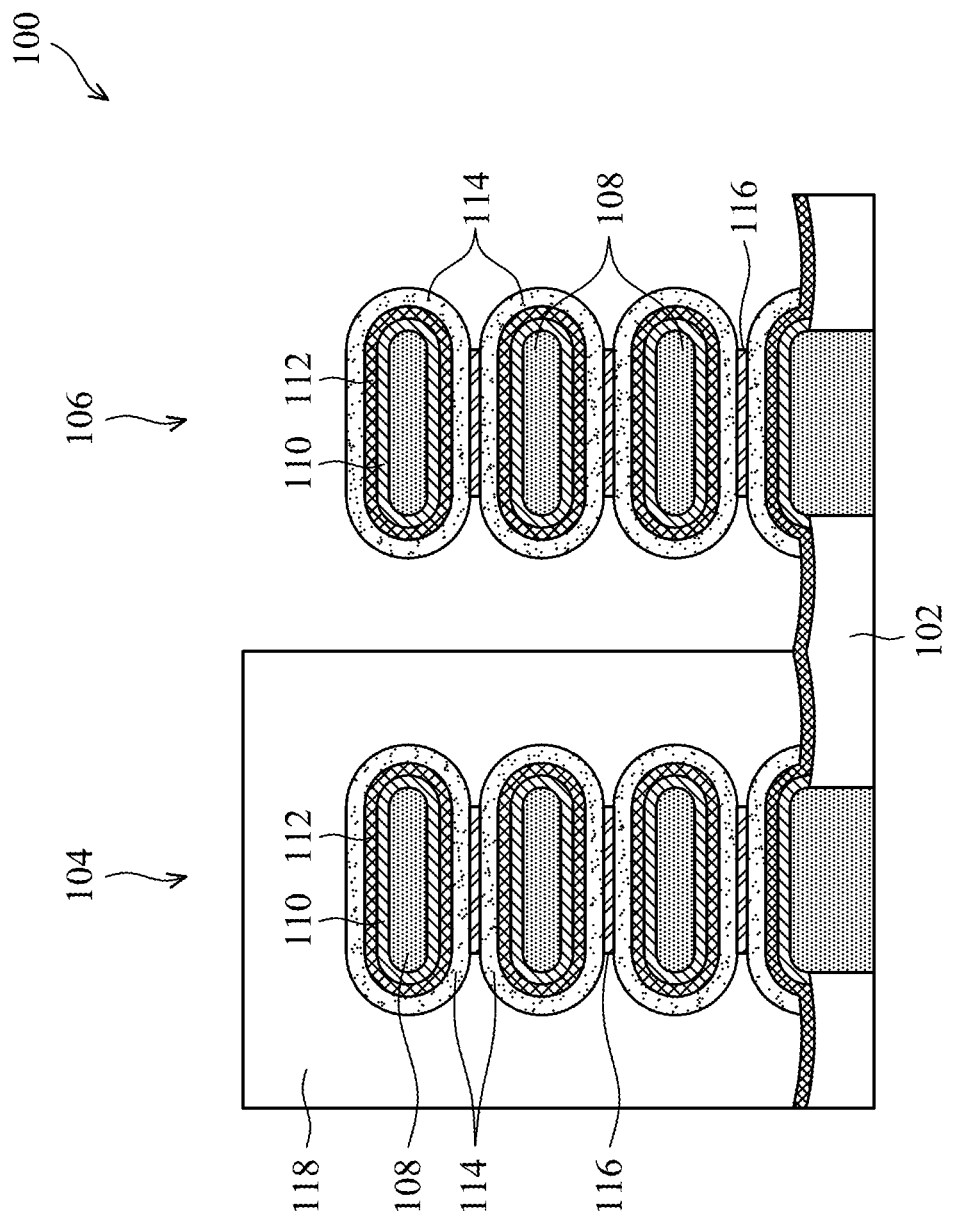

FIG. 1E is a cross-sectional view of the integrated circuit 100, according to one embodiment. In FIG. 1E a layer of photo resist 118 has been deposited and patterned. The layer of photo resist 118 is patterned to expose the cap layer 114 and remaining portion of the hard mask 116 of the core transistor 106. The cap layer 114 and the hard mask layer 116 of the I/O transistor 104 are covered by the layer of photo resist 118. The layer of photo resist 118 can be deposited by standard photo resist deposition techniques including vapor deposition, spread deposition, spin on coating, or by other suitable process. The layer of photo resist 118 can be patterned by exposing the layer of photo resist 118 to light via a photolithography mask. Accordingly, the layer of photo resist 118 can be deposited and patterned using standard photolithography techniques.

Figure 1F:
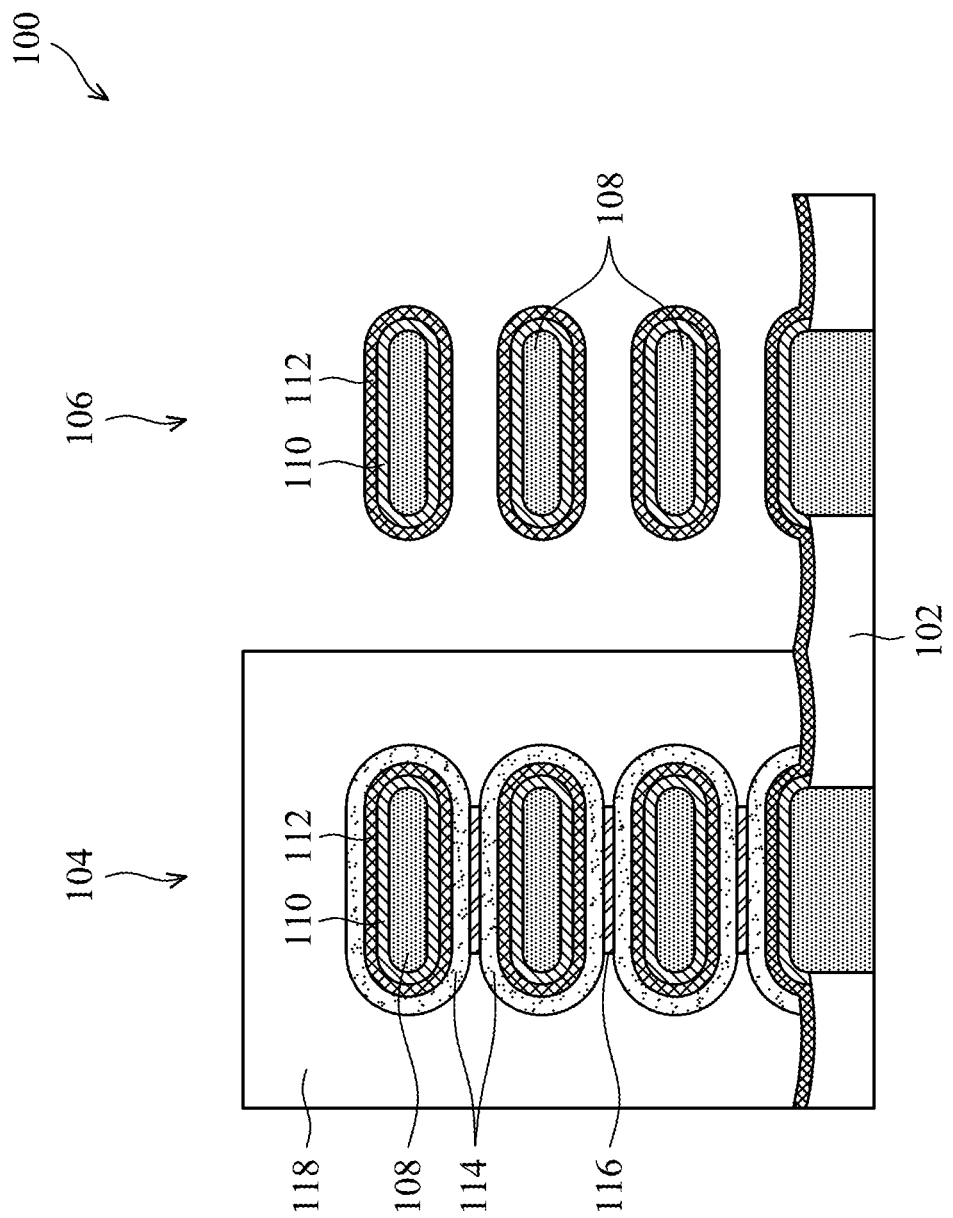

FIG. 1F is a cross-sectional view of the integrated circuit 100, according to one embodiment. In FIG. 1F, an etching process has been performed on the integrated circuit 100. In particular, an etching process is performed on the portion of the integrated circuit 100 that is not covered by the photo resist 118. The etching process etches the cap layer 114 and the hard mask layer 116 from the transistor 106. The etching process can include an isotropic etching process that etches the cap layer 114 and the hard mask layer 116 equally in all directions. The duration of the etching process is selected to entirely remove the cap layer 114 and the hard mask layer 116 from the nanosheets 108 of the transistor 106. The etching process can include a wet etch, a dry etch, an ALE process, a timed etch, or other suitable etching processes. The etching process can include multiple etching steps. For example, a first etching step can be performed to remove the hard mask layer 116. A second etching step can be performed to remove the cap layer 114. Other types of etching processes can be utilized without departing from the scope of the present disclosure.

Figure 1G:
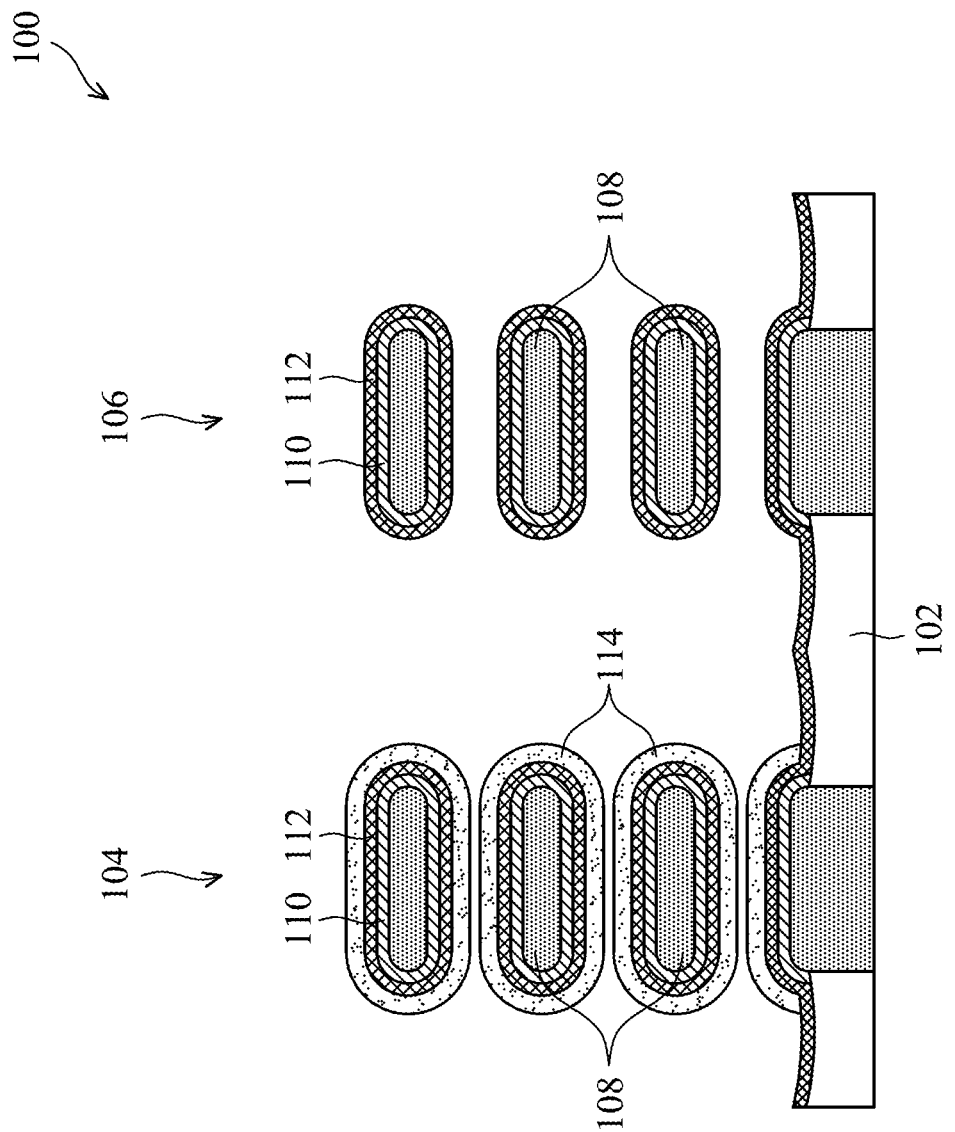

FIG. 1G is a cross-sectional view of the integrated circuit 100, according to one embodiment. In FIG. 1G, the photoresist layer 118 has been removed. The photoresist layer 118 can be removed by a plasma ash process. Other removal processes can be utilized to remove the photo resist layer 118 without departing from the scope of the present disclosure.

In FIG. 1G, the hard mask layer 116 has been removed from the I/O transistor 104. The hard mask layer 116 can be removed via an etching process that selectively etches the hard mask layer 116 with respect to the cap layer 114. The etching process can include a wet etch, a dry etch, an ALE process, a timed etch, or other suitable etching processes. The result of the etching process is that the hard mask layer 116 is entirely removed from between the nanosheets 108 of the I/O transistor 104. Other types of etching processes can be utilized without departing from the scope of the present disclosure.

Figure 1H:
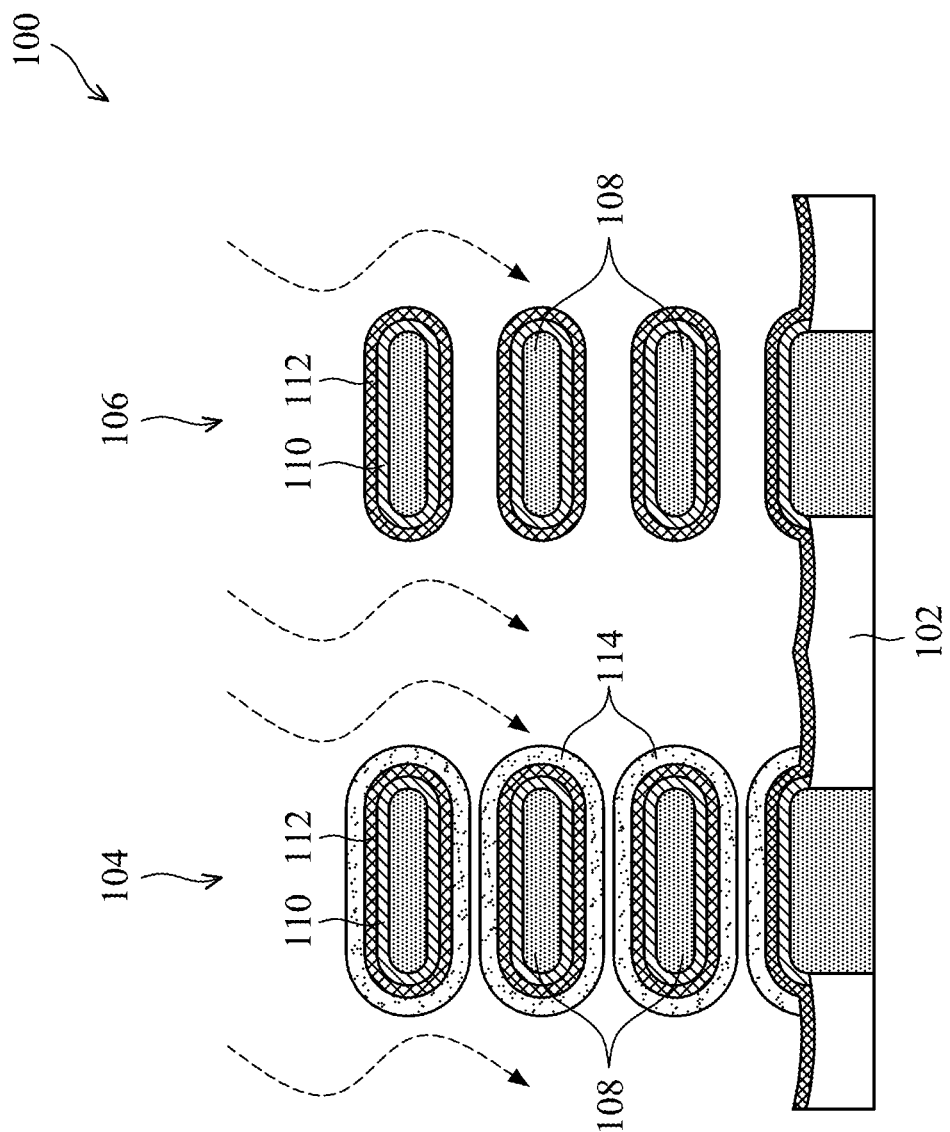

FIG. 1H is a cross-sectional view of the integrated circuit 100, according to one embodiment. In FIG. 1H a thermal annealing process is performed on the integrated circuit 100. The thermal annealing process can include subjecting the integrated circuit 100 to elevated temperatures for a selected duration of time. For example, the thermal annealing process can include subjecting the integrated circuit to temperatures between 100° C. and 600° C. The duration of the thermal annealing process can be between 10 seconds and 5 minutes. Other durations and temperatures can be utilized without departing from the scope of the present disclosure.

The thermal annealing process results in a regrowth of the interfacial dielectric layer 110 of the I/O transistor 104. The regrowth process results in an increase in the thickness of the interfacial dielectric layer 110 of the I/O transistor 104. For reasons explained in more detail below, the regrowth process does not result in an increase in the thickness of the interfacial layer 110 of the core transistor 106. In one embodiment, the thermal annealing process results in an increase in thickness of between 2 Å and 5 Å of the interfacial dielectric layer 110 of the I/O transistor 104. The thermal annealing and regrowth process can result in other increases in thickness without departing from the scope of the present disclosure.

In one embodiment, during the thermal annealing process atoms or material from the cap layer 114 diffuse or otherwise migrate into the interfacial dielectric layer 110. The atoms or material from the cap layer 114 migrate or diffuse through the high-K dielectric layer 112 to the interfacial dielectric layer 110 of the I/O transistor 104. The elevated temperature of the thermal annealing process is the mechanism that enables the diffusion or migration of atoms or material from the cap layer 114 into the interfacial dielectric layer 110 of the I/O transistor 104.

In one example, the cap layer 114 includes TiN or TiSiN. During the thermal annealing process, titanium atoms migrate from the cap layer 114 through the high-K dielectric layer 112 into the interfacial dielectric layer 110. The interfacial dielectric layer 110 incorporates the titanium atoms and expands. Accordingly, after the thermal annealing process interfacial dielectric layer 110 includes titanium atoms. In one embodiment, the concentration of titanium atoms in the interfacial dielectric layer 110 after the thermal annealing process is less than 5% by number. The concentration of titanium atoms in the interfacial dielectric layer 110 may be less than 1% by number. In one embodiment, the interfacial dielectric layer 110 of the I/O transistor 104 includes titanium silicon oxide after the thermal annealing process. The interfacial dielectric layer can include silicon oxide and titanium silicon oxide. In examples in which the interfacial dielectric layer 110 is initially a material other than silicon oxide, the interfacial dielectric layer 110 can include other compounds of titanium in accordance with the initial material of the interfacial dielectric layer 110.

While a specific example has been provided in which titanium atoms diffuse or migrate into the interfacial dielectric layer 110, atoms other than titanium can diffuse or migrate into the interfacial dielectric layer 110 depending on the material of the cap layer 114. For example, if the cap layer 114 includes aluminum oxide, then aluminum atoms may diffuse or migrate into interfacial dielectric layer 110 during the thermal annealing process. In this case, the interfacial dielectric layer 110 will include aluminum atoms having a concentration less than 5% by number. The result is an increase in thickness of the interfacial dielectric layer 110 of the I/O transistor 104. Other atoms than those described above can migrate into the interfacial dielectric layer 110 depending on the material of the cap layer 114.

In one embodiment, the diffusion of atoms or material from the cap layer 114 into the interfacial dielectric layer 110 does not substantially alter the dielectric constant of the interfacial dielectric layer 110. Returning to the example in which titanium atoms migrate into the interfacial dielectric layer 110, the resulting material is a dielectric material with a dielectric constant similar to silicon dioxide. Accordingly, after the regrowth process, the interfacial dielectric layer 110 still retains dielectric properties suitable for serving as a portion of the gate dielectric of the I/O transistor 104.

In one embodiment, the atoms or material from the cap layer 114 also diffuse or migrate into the high-K dielectric layer 112. Accordingly, after the thermal annealing process, the high-K dielectric layer 112 will also include atoms or material from the cap layer 114. The concentration of atoms or material from the cap layer 114 in the high-K dielectric layer 112 is low enough to ensure that the high-K dielectric layer 112 retains a relatively high dielectric constant so that the overall dielectric constant of the gate dielectric of the I/O transistor 104 remain substantially the same after the thermal annealing/regrowth process.

The size and composition of the interfacial dielectric layer 110 and the high-K dielectric layer 112 of the core transistor 106 does not change as a result of the thermal annealing process. This is because the cap layer 114 is not present on the high-K dielectric layer 112 of the core transistor 106 during the thermal annealing process. Accordingly there is no diffusion or migration of atoms or material from the cap layer 114 into the high-K dielectric layer 112 and the interfacial dielectric layer 110 of the core transistor 106. Thus, the size and composition of the gate dielectric of the core transistor 106 is unchanged, while the size and composition of the interfacial dielectric layer 110 of the I/O transistor 104 is changed as a result of the thermal annealing process.

One result of this process is that the I/O transistor 104 is able to withstand higher voltages across its terminals than is the core transistor 106. This is because the interfacial dielectric layer 110 of the I/O transistor 104 is thicker than the interfacial dielectric layer 110 of the core transistor 106 as a result of the thermal annealing/regrowth process performed in relation to FIG. 1H. This may also be due to effects resulting from the presence of a small concentration of metal atoms in the interfacial dielectric layer 110 of the I/O transistor 104.

Figure 1I:
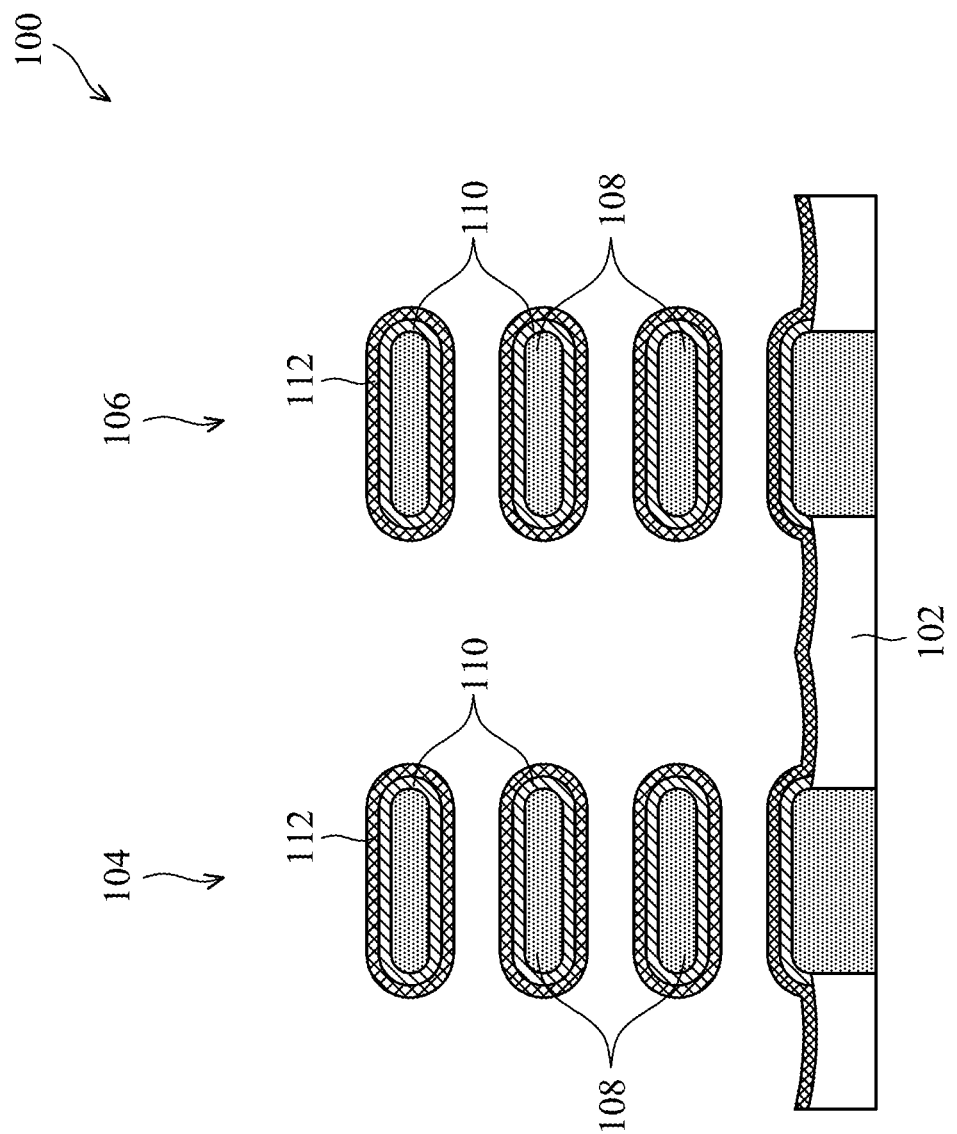

FIG. 1I is a cross-sectional view of the integrated circuit 100, according to one embodiment. In FIG. 1I, the cap layer 114 has been removed from the nanosheets 108 of the I/O transistor 104. The cap layer 114 can be removed via a wet etch, a dry etch, an ALE process, or other suitable etching processes. The duration of the etching process can be selected to ensure that the cap layer 114 is entirely removed from the I/O transistor 104. In FIG. 1I, a gap remains between adjacent nanosheets 108 of the I/O transistor 104 and the core transistor 106. As will be described in more detail below, this enables a gate metal to be deposited surrounding the nanosheets 108 of the I/O transistor 104 and the core transistor 106. In particular, the gate metal will be deposited in contact with the high-K dielectric 112 or with one or more barrier layers or glue layers that may be deposited on the high-K dielectric 112 of the I/O transistor 104 and the core transistor 106.

Figure 1J:
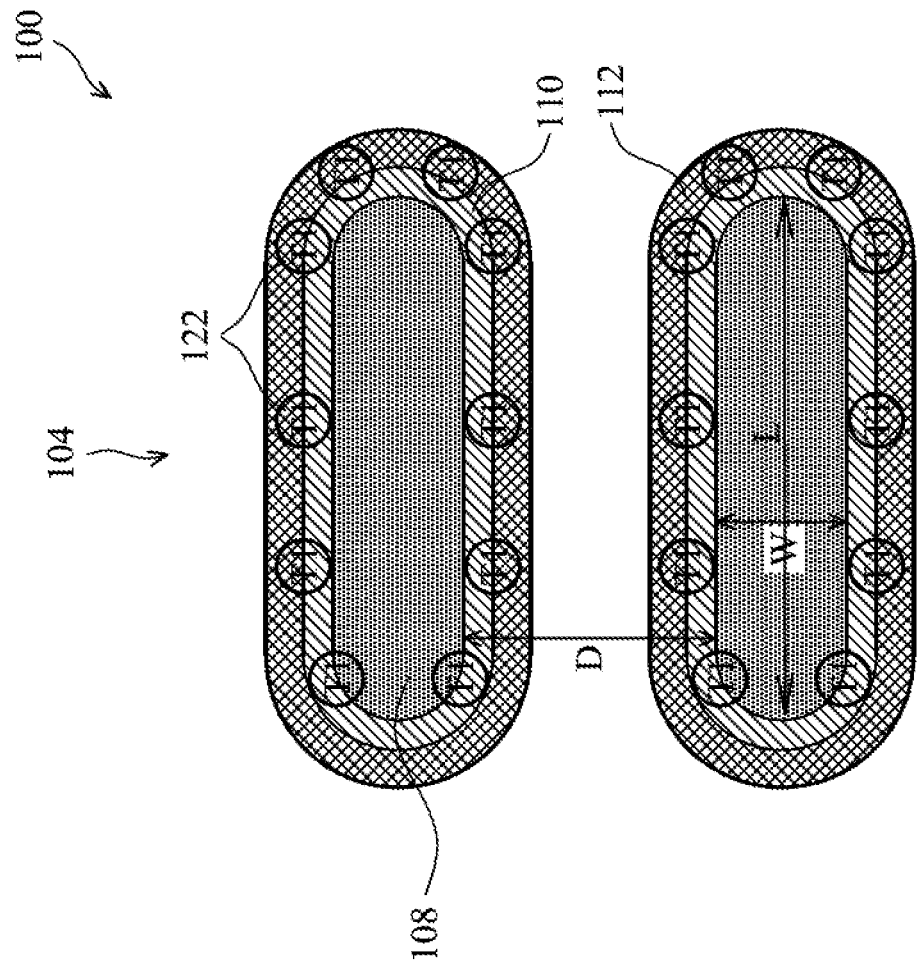

FIG. 1J is a cross-sectional view of the integrated circuit 100, according to one embodiment. In particular, FIG. 1J is an enlarged view of two of the nanosheets 108 of the I/O transistor 104. FIG. 1J provides a visual representation of metal atoms 122 in the interfacial dielectric layer 110 and the high-K dielectric layer 112. In the example of FIG. 1J, the metal atoms 122 are titanium atoms. However, the metal atoms 122 can be other types of metal atoms depending on the composition of the cap layer 114. The metal atoms 122 diffuse or migrate from the cap layer 114 into the interfacial dielectric layer 110 and the high-K dielectric layer 112 during the thermal annealing process described previously in relation to FIG. 1H.

The length L of the nanosheets 108 can be between 10 nm and 50 nm. The width W of the nanosheets 108 can be between 4 nm and 10 nm. The distance D between the nanosheets 108 can be between 8 nm and 15 nm. The thickness of the interfacial dielectric layer 110 of the I/O transistor 104 after the thermal annealing process is between 0.5 nm and 2 nm. The thickness of the high-K dielectric layer 112 of the I/O transistor 104 after the thermal annealing process is between 1 nm and 2 nm. Other thicknesses and dimensions can be utilized for the I/O transistor 104 without departing from the scope of the present disclosure.

Figure 1K:
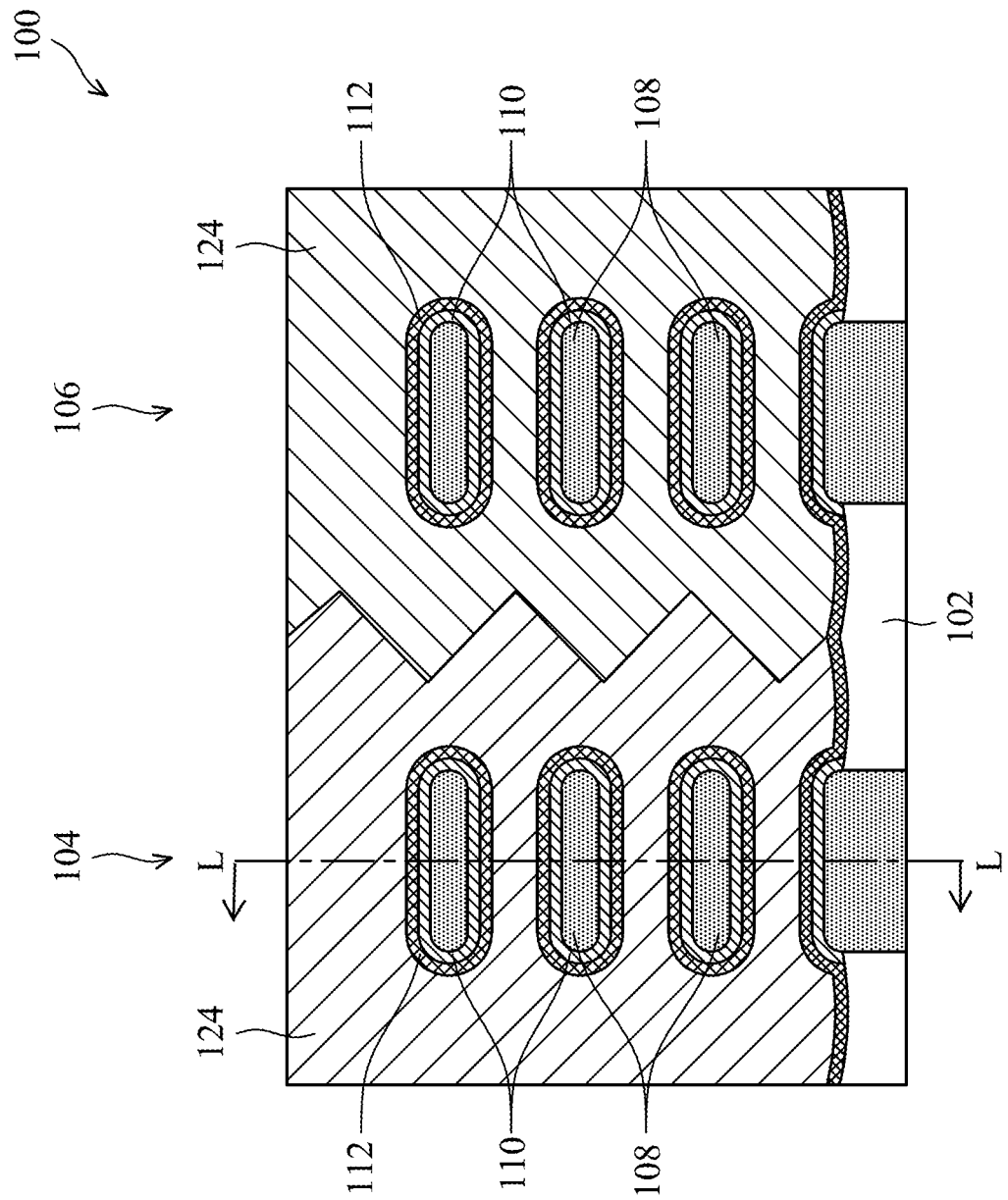

FIG. 1K is a cross-sectional view of the integrated circuit 100, according to one embodiment. In FIG. 1K, a gate metal 124 has been deposited surrounding the nanosheets 108 of the I/O transistor 104 and the core transistor 106. The gate metal 124 is separated from the nanosheets 108 by the interfacial dielectric layer 110 and the high-K dielectric layer 112.

In the view of FIG. 1K, the gate metal 124 is illustrated as a single gate metal. However, in practice, the gate metal 124 may include multiple separate metal layers. For example, the gate metal 124 may include relatively thin glue layers, barrier layers, or work function layers initially deposited on the high-K dielectric layer 112. These initial gate metal layers can include one or more of titanium nitride, tantalum nitride, tungsten nitride, tantalum, or other materials. After deposition of the initial gate metal layers, a gate fill material may be deposited. The gate fill material can include tungsten, titanium, tantalum, cobalt, aluminum, or copper. The initial gate metal layers and the gate fill material collectively make up the gate metal 124. The various layers of the gate metal 124 can be deposited with one or more deposition processes including PVD, CVD, ALD, or other suitable deposition processes. Other materials, types of layers, and deposition processes can be utilized for the gate metal 124 without departing from the scope of the present disclosure.

Figure 1L:
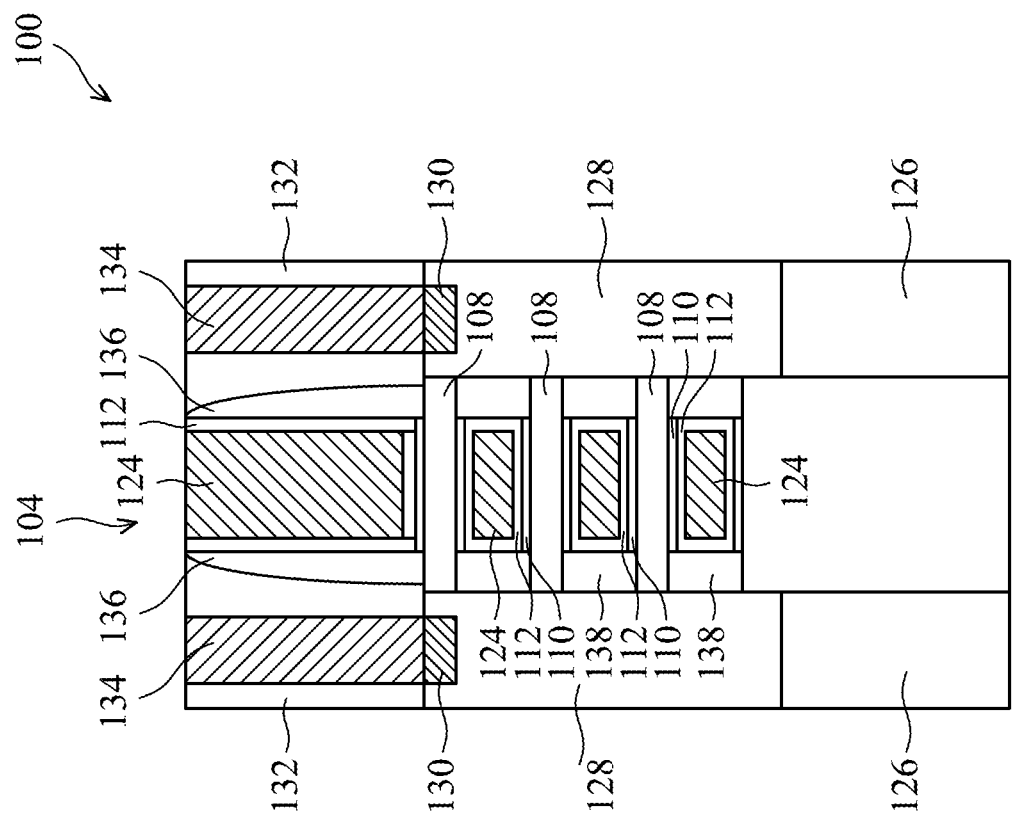

FIG. 1L is a cross-sectional view of the integrated circuit 100, according to one embodiment. The view of FIG. 1L is taken along cross-section lines L-L of FIG. 1K. The view of FIG. 1L illustrates more fully the overall structure of the I/O transistor 104. The structure of the core transistor 106 will be substantially similar to the structure of the I/O transistor 104.

FIG. 1L illustrates shallow trench isolations 126 adjacent to the semiconductor substrate 102. The shallow trench isolation 126 can be utilized to separate groups of transistor structures formed in conjunction with the semiconductor substrate 102. The shallow trench isolation 126 can include a dielectric material. The dielectric material for the shallow trench isolation 126 may include silicon oxide, silicon nitride, silicon oxynitride (SiON), SiOCN, SiCN, fluorine-doped silicate glass (FSG), or a low-K dielectric material, formed by low pressure CVD (LPCVD), plasma-CVD or flowable CVD. Other materials and structures can be utilized for the shallow trench isolation 126 without departing from the scope of the present disclosure.

The integrated circuit 100 includes source and drain regions 128. The source and drain regions 128 includes semiconductor material. The source and drain regions 128 can be grown epitaxially from the semiconductor nanosheets 108. The source and drain regions 128 can be epitaxially grown from the semiconductor nanosheets 108 or from the substrate 102 prior to formation of the nanosheets 108. The source and drain regions 128 can be doped with N-type dopants species in the case of N-type transistors. The source and drain regions 128 can be doped with P-type dopant species in the case of P-type transistors.

The nanosheets 108 extend between the source and drain regions 128. As described previously, the nanosheets 108 correspond to the channel regions of the I/O transistor 104. By applying selected voltages to the gate metal 124 and the source and drain regions 128, current flows through the nanosheets 108 between the source and drain regions 128.

FIG. 1L also illustrates dielectric spacers 138 positioned between the source and drain regions 128 and the gate metal 124. More particularly, the spacers 138 are positioned between the high-K dielectric layer 112 and the source and drain regions 128. The spacers 138 can include one or more dielectric materials including silicon nitride, SiON, SiOCN, SiCN, silicon oxide, or other dielectric materials. Other dielectric materials can be utilized for the spacers 138 without departing from the scope of the present disclosure.

The view of FIG. 1L illustrates the interfacial dielectric layer 110 in contact with the semiconductor nanosheets 108. The high-K dielectric layer 112 is in contact with the interfacial dielectric layer 110. The gate metal 124 is in contact with the high-K dielectric layer 112.

The integrated circuit 100 includes an interlayer dielectric layer 132 positioned on the source and drain regions 128. The interlayer dielectric layer 132 can include one or more of silicon oxide, silicon nitride, SICOH, SiOC, or an organic polymer. Other types of dielectric materials can be utilized for the interlayer dielectric layer 132 without departing from the scope of the present disclosure.

The integrated circuit 100 includes silicide regions 130 that have been formed in the source and drain regions 128. The silicide regions 130 can include titanium silicide, cobalt silicide, or other types of silicide. Contact plugs 134 have been formed in the interlayer dielectric layer 132. The contact plugs 134 can include cobalt or another suitable conductive material. The contact plugs 134 can be utilized to apply voltages to the source and drain regions 128 of the transistor 104. The contact plugs 134 can be surrounded by a titanium nitride glue layer.

The gate metal 124 has been deposited in a trench formed in the interlevel dielectric layer 132. The gate metal 124 also surrounds the nanosheets 108 as shown in FIG. 1L and FIG. 1K. Sidewall spacers 136 are positioned around the gate metal 124 in the trench in the interlevel dielectric layer 132. The sidewall spacers 136 can include multiple dielectric layers including one or more of silicon nitride, silicon oxide, silicon carbide, or other suitable dielectric materials. The high-K dielectric layer 112 is also positioned on the sidewalls of the trench between the sidewall spacers 136 and the gate metal 124. Other materials, structures, and features can be included in the gate all around I/O transistor 104, and correspondingly, the gate all around core transistor 106 without departing from the scope of the present disclosure.

Figure 2:
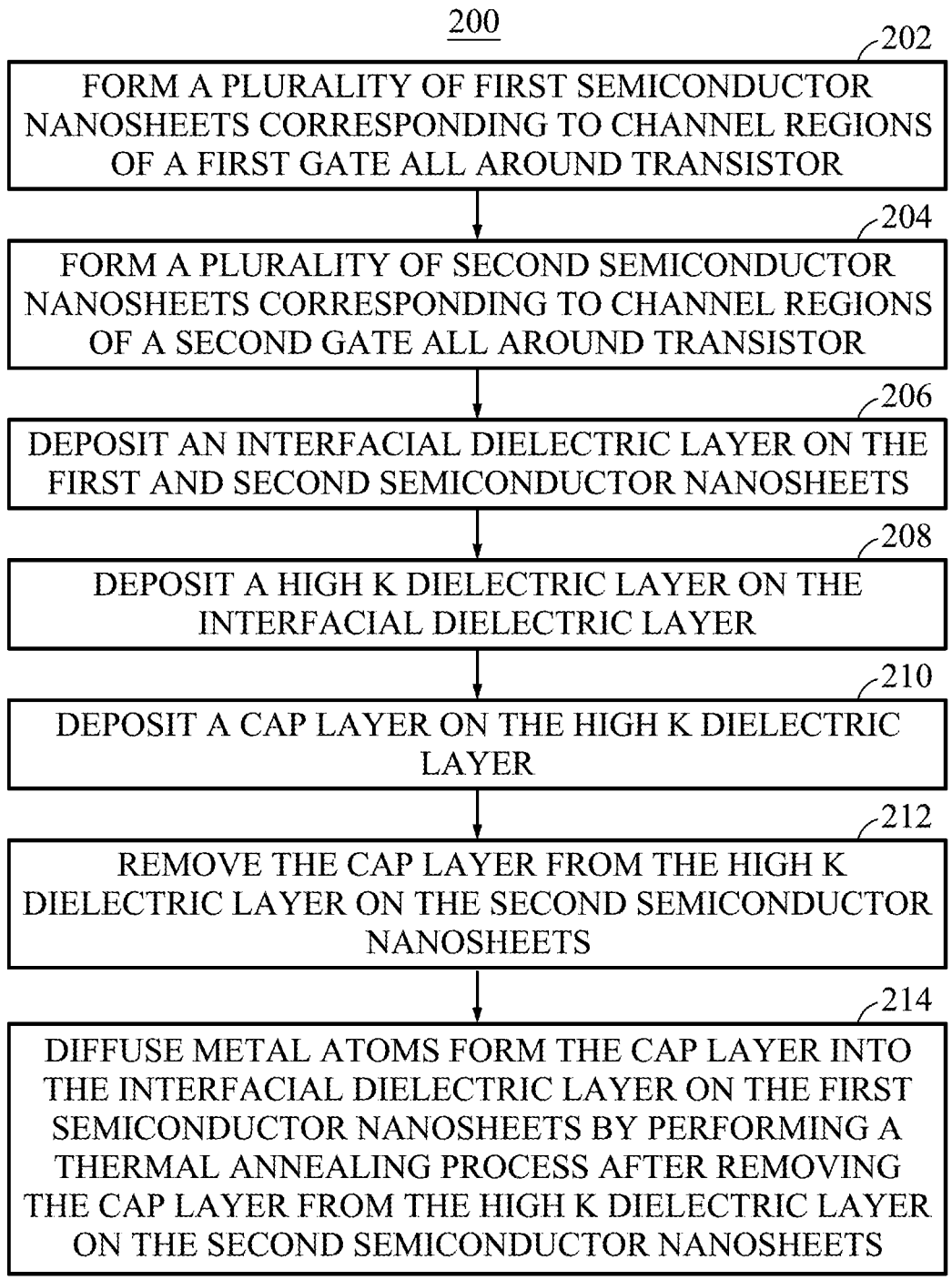
FIG. 2 is a flow diagram of a method for forming an integrated circuit, according to one embodiment.

FIG. 2 is a flow diagram of a method 200 for forming an integrated circuit, according to one embodiment. The method 200 can utilize structures, processes, and components disclosed in relation to FIGS. 1A-1L. At 202, the method 200 includes forming a plurality of first semiconductor nanosheets corresponding to channel regions of a first gate all around transistor. One example of a first gate all around transistor is the gate all around transistor 104 of FIGS. 1I-1L. One example of first semiconductor nanosheets are the semiconductor nanosheets 108 of the transistor 104 of FIGS. 1I-1L. At 204, the method 200 includes forming a plurality of second semiconductor nanosheets corresponding to channel regions of a second gate all around transistor. One example of a second gate all around transistor is the gate all around transistor 106 of FIGS. 1I-1L. One example of second semiconductor nanosheets are the semiconductor nanosheets 108 of the transistor 106 of FIGS. 1I-1L. At 206, the method 200 includes depositing an interfacial dielectric layer on the first and second semiconductor nanosheets. One example of an interfacial dielectric layer is the interfacial dielectric layer 110 of FIG. 1A. At 208, the method 200 includes depositing a high-K dielectric layer on the interfacial dielectric layer. One example of a high-K dielectric layer is the high-K dielectric layer 112 of FIG. 1A. At 210, the method 200 includes depositing a cap layer on the high-K dielectric layer. One example of a cap layer is the cap layer 114 of FIG. 1B. At 212, the method 200 includes removing the cap layer from the high-K dielectric layer on the second semiconductor nanosheets. At 214, the method 200 includes diffusing metal atoms from the cap layer into the interfacial dielectric layer on the first semiconductor nanosheets by performing a thermal annealing process after removing the cap layer from the high-K dielectric layer on the second semiconductor nanosheets. One example of metal atoms are the metal atoms 122 of FIG. 1J.

Figure 3:
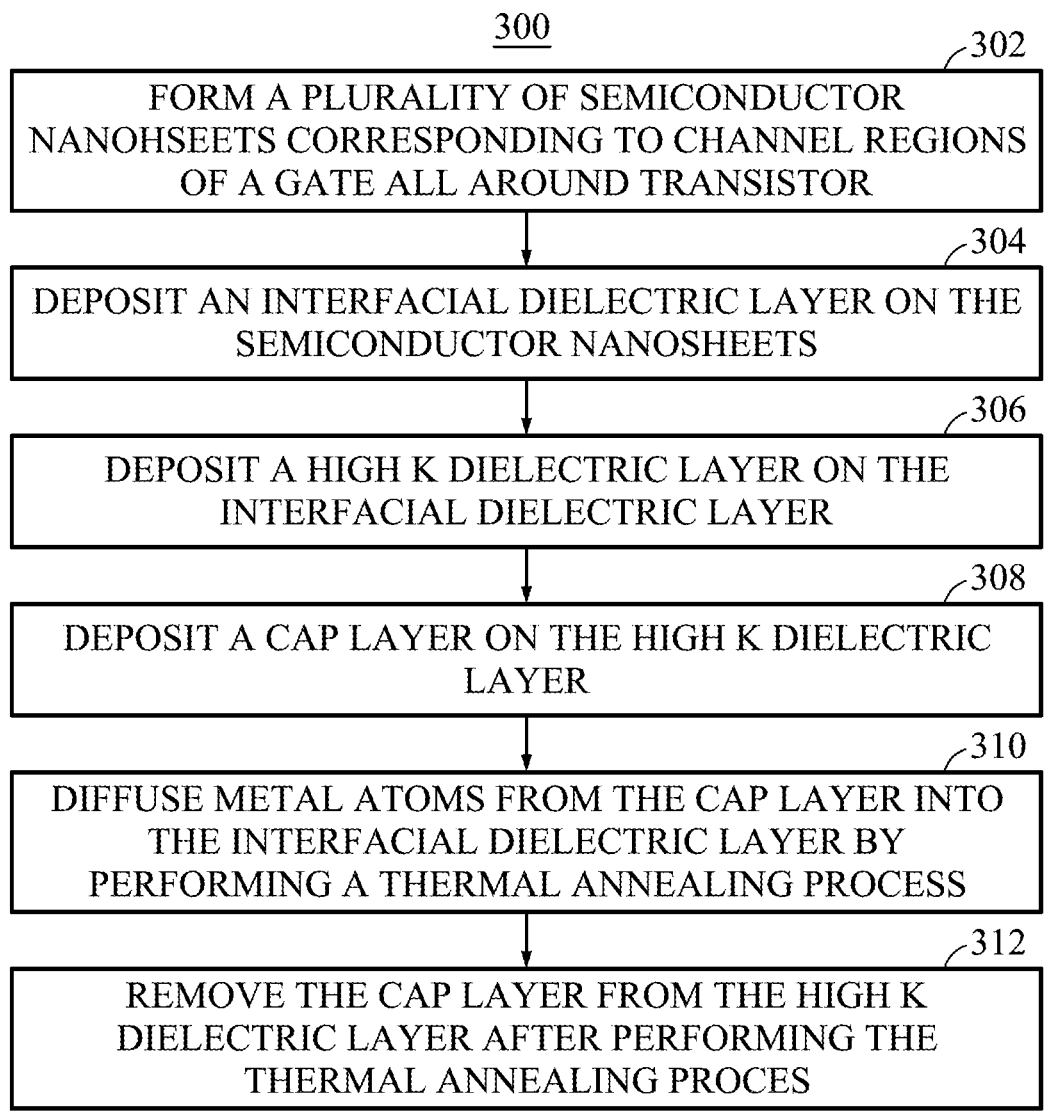
FIG. 3 is a flow diagram of a method for forming an integrated circuit, according to one embodiment.

FIG. 3 is a flow diagram of a method 300 for forming an integrated circuit, according to one embodiment. The method 300 can utilize structures, processes, and components disclosed in relation to FIGS. 1A-2. At 302, the method 300 includes forming a plurality of semiconductor nanosheets corresponding to channel regions of a gate all around transistor. One example of a gate all around transistor is the transistor 104 of FIGS. 1A-1L. One example of semiconductor nanosheets is the semiconductor nanosheets 108 of FIG. 1A. At 304, the method 300 includes depositing an interfacial dielectric layer on the semiconductor nanosheets. One example of an interfacial dielectric layer is the interfacial dielectric layer 110 of FIG. 1A. At 306, the method 300 includes depositing a high-K dielectric layer on the interfacial dielectric layer. One example of a high-K dielectric layer is the high-K dielectric layer 112 of FIG. 1A. At 308, method 300 includes depositing a cap layer on the high-K dielectric layer. One example of a cap layer is the cap layer 114 of FIG. 1B. At 310, the method 300 includes diffusing metal atoms from the cap layer into the interfacial dielectric layer by performing a thermal annealing process. One example of metal atoms is a metal atoms 122 of FIG. 1J. At 312, the method 300 includes removing the cap layer from the high-K dielectric layer after performing the thermal annealing process.

In one embodiment, a method includes forming a plurality of first semiconductor nanosheets corresponding to channel regions of a first gate all around transistor, forming a plurality of second semiconductor nanosheets corresponding to channel regions of a second gate all around transistor, and depositing an interfacial dielectric layer on the first and second semiconductor nanosheets. The method includes depositing a high-K dielectric layer on the interfacial dielectric layer, depositing a cap layer on the high-K dielectric layer, and removing the cap layer from the high-K dielectric layer on the second semiconductor nanosheets. The method includes diffusing metal atoms from the cap layer into the interfacial dielectric layer on the first semiconductor nanosheets by performing a thermal annealing process after removing the cap layer from the high-K dielectric layer on the second semiconductor nanosheets.

In one embodiment, an integrated circuit includes a first gate all around transistor including a plurality of first semiconductor nanosheets corresponding to channel regions of the first gate all around transistor and a first interfacial dielectric layer posited on the first semiconductor nanosheets and including metal atoms. The first gate all around transistor includes a first high-K dielectric layer positioned on the first interfacial dielectric layer.

In one embodiment, the integrated circuit also includes a second gate all around transistor including a plurality of second semiconductor nanosheets corresponding to channel regions of the second gate all around transistor and a second interfacial dielectric layer posited on the second semiconductor nanosheets. The second gate all around transistor includes a second high-K dielectric layer positioned on the second interfacial dielectric layer.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming a plurality of semiconductor nanosheets corresponding to channel regions of a gate all around transistor;
depositing an interfacial dielectric layer on the semiconductor nanosheets;
depositing a high-K dielectric layer on the interfacial dielectric layer;
depositing a cap layer on the high-K dielectric layer;
diffusing metal atoms from the cap layer into the interfacial dielectric layer by performing a thermal annealing process; and
removing the cap layer from the high-K dielectric layer after performing the thermal annealing process.

2. The method of claim 1, further comprising increasing a thickness of the interfacial dielectric layer by performing the thermal annealing process.

3. The method of claim 2, wherein the thermal annealing process is a regrowth process of the interfacial dielectric layer.

4. The method of claim 3, wherein performing the thermal annealing process includes diffusing metal atoms into the high-K dielectric layer.

5. The method of claim 1, wherein the cap layer includes titanium, wherein the metal atoms are titanium atoms.

6. The method of claim 5, wherein the cap layer includes aluminum, wherein the metal atoms are aluminum.

7. The method of claim 1, further comprising depositing a gate metal surrounding the semiconductor nanosheets after removing the cap layer.

8. A method, comprising:
forming a plurality of first semiconductor nanosheets corresponding to channel regions of a first gate all around transistor;
forming a plurality of second semiconductor nanosheets corresponding to channel regions of a second gate all around transistor;
depositing an interfacial dielectric layer on the first and second semiconductor nanosheets;
depositing a high-K dielectric layer on the interfacial dielectric layer;
depositing a cap layer on the high-K dielectric layer;
removing the cap layer from the high-K dielectric layer on the second semiconductor nanosheets; and
diffusing metal atoms from the cap layer into the interfacial dielectric layer on the first semiconductor nanosheets by performing a thermal annealing process after removing the cap layer from the high-K dielectric layer on the second semiconductor nanosheets.

9. The method of claim 8, further comprising removing the cap layer from the high-K dielectric layer on the first semiconductor nanosheets after performing the thermal annealing process.

10. The method of claim 9, further comprising depositing a gate metal surrounding the first and second semiconductor nanosheets after removing the cap layer from the high-K dielectric layer on the first semiconductor nanosheets.

11. The method of claim 8, further comprising:
forming a mask over the cap layer;
patterning the mask to expose the cap layer on the high-K dielectric layer of the second semiconductor nanosheets; and
removing the cap layer from the high-K dielectric layer on the second semiconductor nanosheets while the cap layer on the high-K dielectric on the first semiconductor nanosheets is covered by the mask.

12. The method of claim 8, wherein the interfacial dielectric layer is thicker on the first semiconductor nanosheets than on the second semiconductor nanosheets after the thermal annealing process.

13. The method of claim 12, wherein the interfacial dielectric layer has a same thickness on the first semiconductor nanosheets and the second semiconductor nanosheets prior to the thermal annealing process.

14. An integrated circuit, comprising:
a first gate all around transistor including:
a plurality of first semiconductor nanosheets corresponding to channel regions of the first gate all around transistor;
a first interfacial dielectric layer positioned on the first semiconductor nanosheets and including metal atoms; and
a first high-K dielectric layer positioned on the first interfacial dielectric layer.

15. The integrated circuit of claim 14, further comprising:
a second gate all around transistor including:
a plurality of second semiconductor nanosheets corresponding to channel regions of the second gate all around transistor;
a second interfacial dielectric layer positioned on the second semiconductor nanosheets; and
a second high-K dielectric layer positioned on the second interfacial dielectric layer.

16. The integrated circuit of claim 15, wherein the first interfacial dielectric layer is thicker than the second interfacial dielectric layer.

17. The integrated circuit of claim 16, wherein a concentration of the metal atoms in the first interfacial dielectric layer is greater than a concentration of the metal atoms in the second interfacial dielectric layer.

18. The integrated circuit of claim 17, wherein the concentration of the metal atoms in the second interfacial dielectric layer is substantially zero.

19. The integrated circuit of claim 16, wherein the first gate all around transistor is an I/O transistor and the second gate all around transistor is a core transistor subject to lower voltages than the I/O transistor.

20. The integrated circuit of claim 14, wherein the metals atoms include titanium or aluminum.

* * * * *